United States Patent
Yang et al.

(10) Patent No.: US 8,374,563 B2
(45) Date of Patent: Feb. 12, 2013

(54) GAIN CONTROL CIRCUIT OF THE WIRELESS RECEIVER

(75) Inventors: Chan-Sheng Yang, Hsinchu (TW); Wen-Shih Lu, Hsinchu (TW); Yu-Hua Liu, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 937 days.

(21) Appl. No.: 12/470,050

(22) Filed: May 21, 2009

(65) Prior Publication Data

US 2010/0015937 A1    Jan. 21, 2010

(30) Foreign Application Priority Data

Jul. 18, 2008   (TW) ................................ 97127473 A

(51) Int. Cl.
  *H04B 1/06*  (2006.01)
  *H04K 3/00*  (2006.01)
(52) U.S. Cl. ................. 455/241.1; 455/245.2; 455/253.2
(58) Field of Classification Search ............... 455/241.1, 455/245.2, 247.1, 251.1, 253.2; 375/345
  See application file for complete search history.

(56) References Cited

U.S. PATENT DOCUMENTS

| | | | | |
|---|---|---|---|---|
| 6,748,200 B1 * | 6/2004 | Webster et al. | ............ | 455/234.1 |
| 6,836,647 B2 * | 12/2004 | Rimini et al. | ............... | 455/226.2 |
| 7,076,225 B2 * | 7/2006 | Li et al. | ........................ | 455/245.1 |
| 2003/0083031 A1 | 5/2003 | Eriksson et al. | | |
| 2003/0186665 A1 | 10/2003 | Black et al. | | |
| 2007/0230636 A1 * | 10/2007 | Murthy et al. | ................. | 375/345 |

* cited by examiner

*Primary Examiner* — Lee Nguyen
(74) *Attorney, Agent, or Firm* — Muncy, Geissler, Olds & Lowe, PLLC

(57) ABSTRACT

A gain control circuit of the wireless receiver comprises a plurality of stages-amplifier, an analog gain control circuit, and a digital gain control circuit, wherein the analog gain control circuit generates an analog controlling voltage for regulating the gain of the post-amplifier by an analog gain controlling process, and the digital gain control circuit is used for determining a plurality of gain curves for the pre-amplifier, and the gain curves are all operating between the first default voltage and second default voltage. While the analog controlling voltage is over the first default voltage or second default voltage, the gain curve will be switched, thereby, the analog gain controlling process can be with the digital gain controlling process therein for improving the linearity of the gain regulation and reducing the transient response during the gain switching process.

21 Claims, 8 Drawing Sheets

GAIN CONTROL CIRCUIT OF THE WIRELESS RECEIVER

FIELD OF THE INVENTION

The present invention relates in general to a gain control circuit of the wireless receiver, and more particularly to a gain control circuit of the wireless receiver that has the digital gain controlling process within the analog gain controlling process for improving the linearity during the gain regulation and reducing the transient response during the gain switching process.

BACKGROUND OF THE INVENTION

The gain control circuit of the wireless receiver is used for achieving the purpose of high dynamic range; accordingly, the amplifier gain can be altered depending on the magnitude of the input signal. Therefore, while the magnitude of the input signal is small, the gain control circuit will be with high gain amplified the input signal, otherwise, while the magnitude of the input signal is large, the gain control circuit will be with low gain amplified the input signal, thereby, it is advantageously for demodulating by the further demodulator.

The analog gain controlling process or digital gain controlling process is selectively used for regulating the gain of each stage amplifier according to the prior art, wherein the analog gain control circuit can be applied to switch the gain of the amplifier slowly for reducing the transient response, thereby, the affect with respect to the quality of the input signal can be prevented.

Nevertheless, the RF specification of each stage amplifier has to be considered for each other during the gain regulation for preventing the error occurred while the analog gain controlling process is applied, therefore, according to the amplifier being with the exact RF specification, such as low noise amplifier (LNA), the amplifier will be easily to operate within the non-linear area while the gain thereof is regulating by the analog gain controlling process, such that the gain of the input signal will not achieve the requirement of the linearity, accordingly, the wireless receiver cannot be operated optimally.

The digital gain control circuit is used for improving the gain linear of the amplifier. In detail, the gain of each stage amplifier can be regulated respectively according to the RF specification thereof, as well as, the consideration for the RF specification of each stage amplifier is unnecessary during the gain regulation, thereby, the wireless receiver will be with better linear accordingly.

However, since the requirement of the gain magnitude can be reached at once by the digital gain controlling process, the input signal will be with transient response occurred intensely while the gain magnitude is increased or decreased substantially, therefore, the difficulty of the input signal demodulation will be increased due to the input signal has been effected by the transient response. That is, there are still defects on the analog gain controlling process and digital gain controlling process for regulating the gain of each stage amplifier surely.

SUMMARY OF THE INVENTION

It is the primary objective of the present invention to provide a gain control circuit of the wireless receiver, which regulates the amplifier gain by the analog gain controlling process and the digital gain controlling process, especially for the amplifier being with the exact RF specification, for improving the linearity during the gain regulation.

It is the secondary objective of the present invention to provide a gain control circuit of the wireless receiver, wherein the digital gain control circuit determines multi-level gain curves, thereby, the amount of the comparator can be reduced within the digital gain control circuit for reducing the cost thereof due to each gain curve is operated under the same voltage section.

It is another objective of the present invention to provide a gain control circuit of the wireless receiver, wherein since the digital gain control circuit determines multi-level gain curves, the proper gain curve can be switched step by step gradually for preventing an intense transient response.

To achieve the above mentioned and other objectives, the present invention provides a gain control circuit of the wireless receiver, comprising: a plurality of stage-amplifiers, comprising at least one pre-amplifier and a plurality of post-amplifiers, wherein the post-amplifiers are connected to the pre-amplifier; an analog gain control circuit, connected to the post-amplifier, used for generating an analog controlling voltage to regulate the gain of the post-amplifier by an analog gain controlling process; and a digital gain control circuit, connected to the analog gain control circuit and the pre-amplifier, used for receiving the analog controlling voltage, and determining multi-level gain curves for the pre-amplifier, wherein the gain curves are all operated between a first default voltage and a second default voltage, wherein while the analog controlling voltage is over than the voltage section between the first default voltage and the second default voltage, the gain curve will be switched.

The present invention further provides a gain control circuit of the wireless receiver, comprising: a plurality of stage-amplifiers, comprising at least one pre-amplifier and a plurality of post-amplifiers, wherein the post-amplifiers are connected to the pre-amplifier; an analog gain control circuit, connected to the post-amplifier, used for generating an analog controlling voltage to regulate the gain of the post-amplifiers by the analog gain controlling process; and a digital gain control circuit, connected to the analog gain control circuit and the pre-amplifier, used for receiving the analog controlling voltage, and determining the multi-level gain curves for the pre-amplifier, wherein the gain curves are all operated between a first default voltage and a second default voltage, wherein a plurality of voltage sections are provided between the first default voltage and the second default voltage, and each gain curve is operated in the different corresponding voltage section, wherein while said analog controlling voltage is over than said voltage section that is corresponding to each gain curve, the gain curve will be switched to be another, wherein two adjacent gain curves are operated under the corresponding voltage sections, partial areas of which are overlap.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF DISCLOSED EMBODIMENTS

Figure 1:
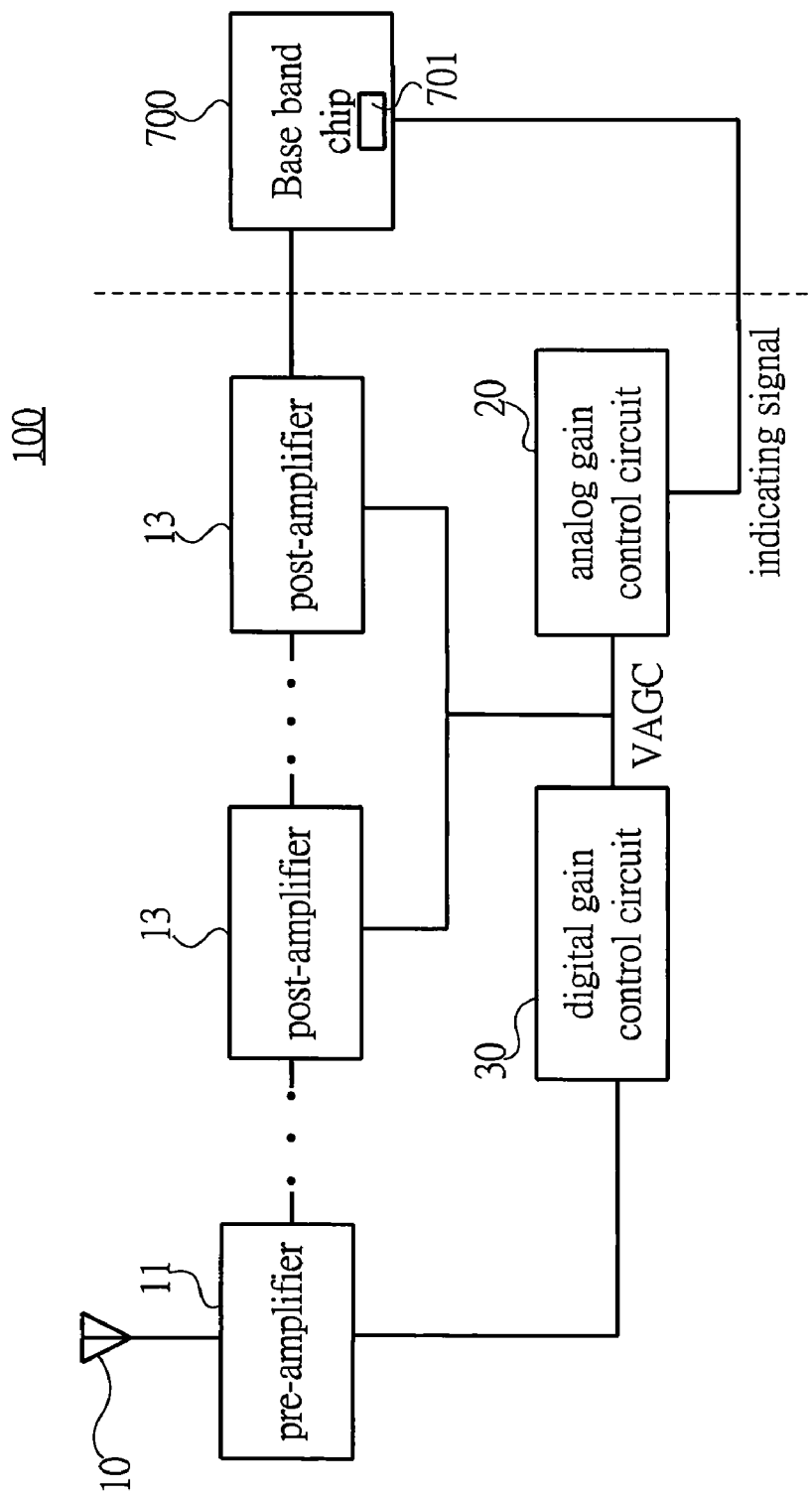
FIG. 1 is a block diagram showing a gain control circuit of the wireless receiver according to a preferred embodiment of the present invention.
Figure 2:
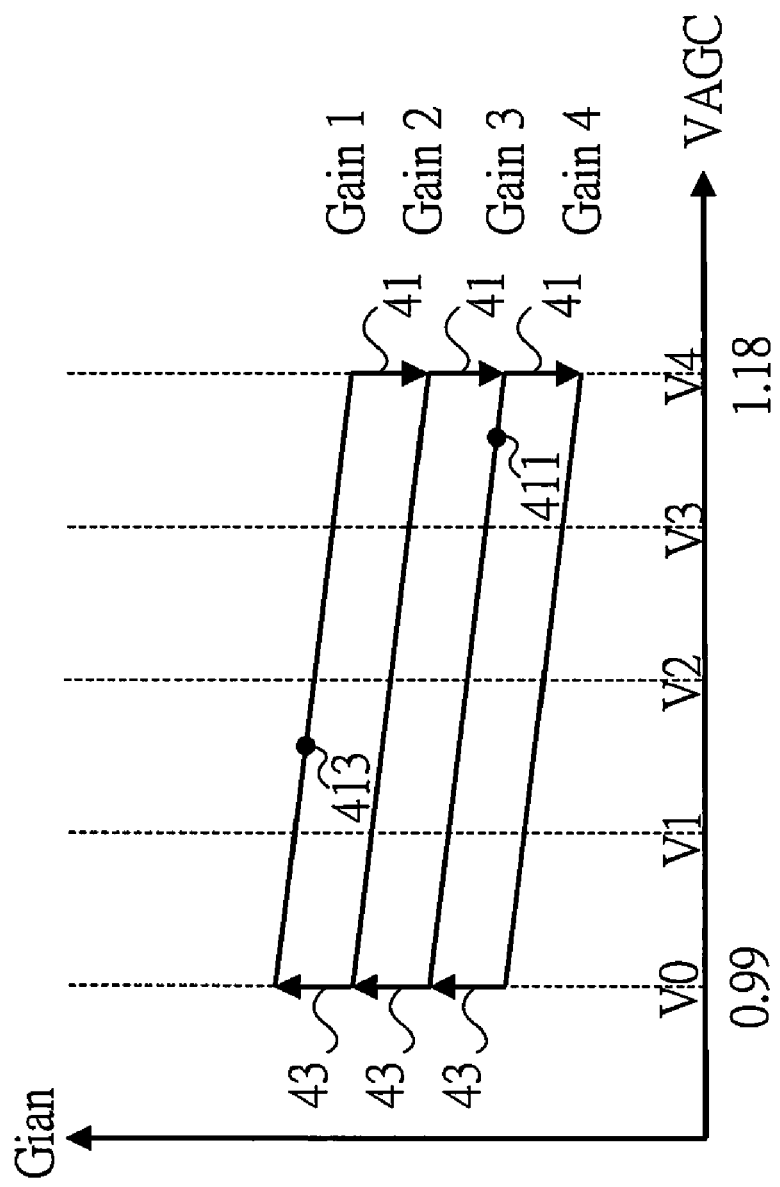
FIG. 2 is a curve diagram showing the gain curve of the digital gain control circuit according to the preferred embodiment of the present invention.

Referring to FIG. 1 and FIG. 2, a block diagram showing a gain control circuit of the wireless receiver, and a curve diagram showing the gain curve of the digital gain control circuit according to the preferred embodiment of the present invention are disclosed. The wireless receiver 100 comprises a plurality of stage-amplifiers 11 and 13, an analog gain control circuit 20, and a digital gain control circuit 30.

The amplifier comprises at least one pre-amplifier 11 and a plurality of post-amplifiers 13. The pre-amplifier 11 is a low noise amplifier (LNA), and the post-amplifier 13 is a intermediate-frequency amplifier (IFA) and/or a power amplifier (PA), wherein the post-amplifier 13 is connected to the pre-amplifier 11, thereby, each of stage-amplifiers 11 and 13 can regulate the gain of the input signal that is received from the antenna 10, wherein the input signal is a RF or analog signal.

The analog gain control circuit 20 is connected to each of post-amplifiers 13, used for receiving an indicating signal, wherein the indicating signal is generated by a signal indicator 701, which can be integrated within a base band chip 700, a intermediate-frequency (IF) circuit, or a zero-intermediate-frequency (Zero-IF) circuit.

Normally, the wireless receiver 100 can determine a base value of the fixed amplitude, and further, the signal indicator 701 will determine the amplified gain of the wireless receiver 100 is higher or lower according to the base value, correspondingly, the indicating signal will be generated to inform the wireless receiver 100 to regulate the gain, thereby, the input signal will be shrank or enlarged to be as well as the amplitude of the base value.

The analog gain control circuit 20 is used for receiving said indicating signal, and further, generating an analog controlling voltage (VAGC), wherein the analog controlling voltage (VAGC) regulates the gain of the post-amplifier 13 by the analog gain controlling process.

The digital gain control circuit 30 is connected to the analog gain control circuit 20 and the pre-amplifier 11, used for receiving the analog controlling voltage (VAGC), determining the multi-level gain curves for the pre-amplifier 11, such as Gain 1 to Gain 4, as well as, and determining a first default voltage V0 and a second default voltage V4.

Each level gain curve will be all operated with overlapping under the voltage section that is between the first default voltage V0 and second default voltage V4, as shown on FIG. 2. While the analog controlling voltage (VAGC) is over than the voltage section, the digital gain control circuit 30 will switch the gain curve for regulating the gain of the pre-amplifier 11 by the digital gain controlling process.

According to the embodiment of the present invention, the analog gain controlling process is used for mainly regulating the gain, and further, a small gain section, such as 12 db, can be the regulation section for the digital gain controlling process, wherein the small gain section is sampled from the gain section of the wireless receiver 100, such as 80 db. Therefore, since the analog gain controlling process and digital gain controlling process can be processed cooperatively, the non-linear operation can be prevented while the analog gain controlling process is only applied for regulating the gain, thereby, the gain regulation linearity for the wireless receiver can be improved.

Figure 3:
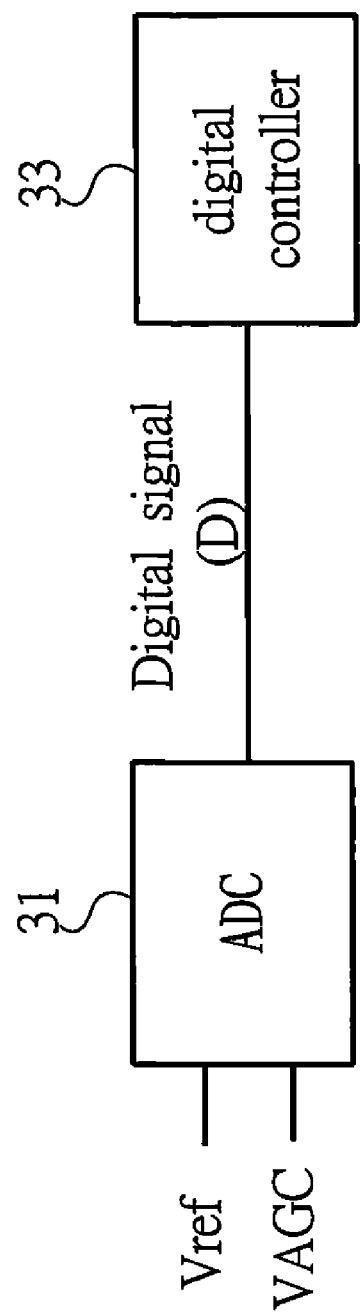
FIG. 3 is a block diagram showing the digital gain control circuit according to the preferred embodiment of the present invention.

Referring to FIG. 2 and FIG. 3, a curve diagram showing the gain curve of the digital gain control circuit, and a block diagram showing the digital gain control circuit according to the preferred embodiment of the present invention are disclosed. The digital gain control circuit 30 comprises an analog to digital converter (ADC) 31 and a digital controller 33, wherein the analog to digital converter (ADC) 31 is used for receiving an analog controlling voltage (VAGC) and a reference voltage Vref, and further, outputting a digital signal D.

The analog to digital converter (ADC) 31 determines the first default voltage V0 and second default voltage V4 from the reference voltage Vref, and further, determines a plurality of voltage levels V0, V1, V2, V3, V4, and so on, between the first default voltage V0 and second default voltage V4. The analog controlling voltage (VAGC) will compare with each voltage level for generating a digital signal D correspondingly, wherein the analog to digital converter (ADC) 31 can be a flash analog to digital converter (Flash ADC).

The digital controller 33 is connected to the analog to digital converter (ADC) 31, used for receiving the digital signal D, and further, switching the gain curve according to the digital signal D. Moreover, the digital controller 33 will determine the multi-level gain curves for the pre-amplifier 11, and further, switch to the upper-level or next-level with respect to the current level gain curve according to the digital signal D.

Figure 4:
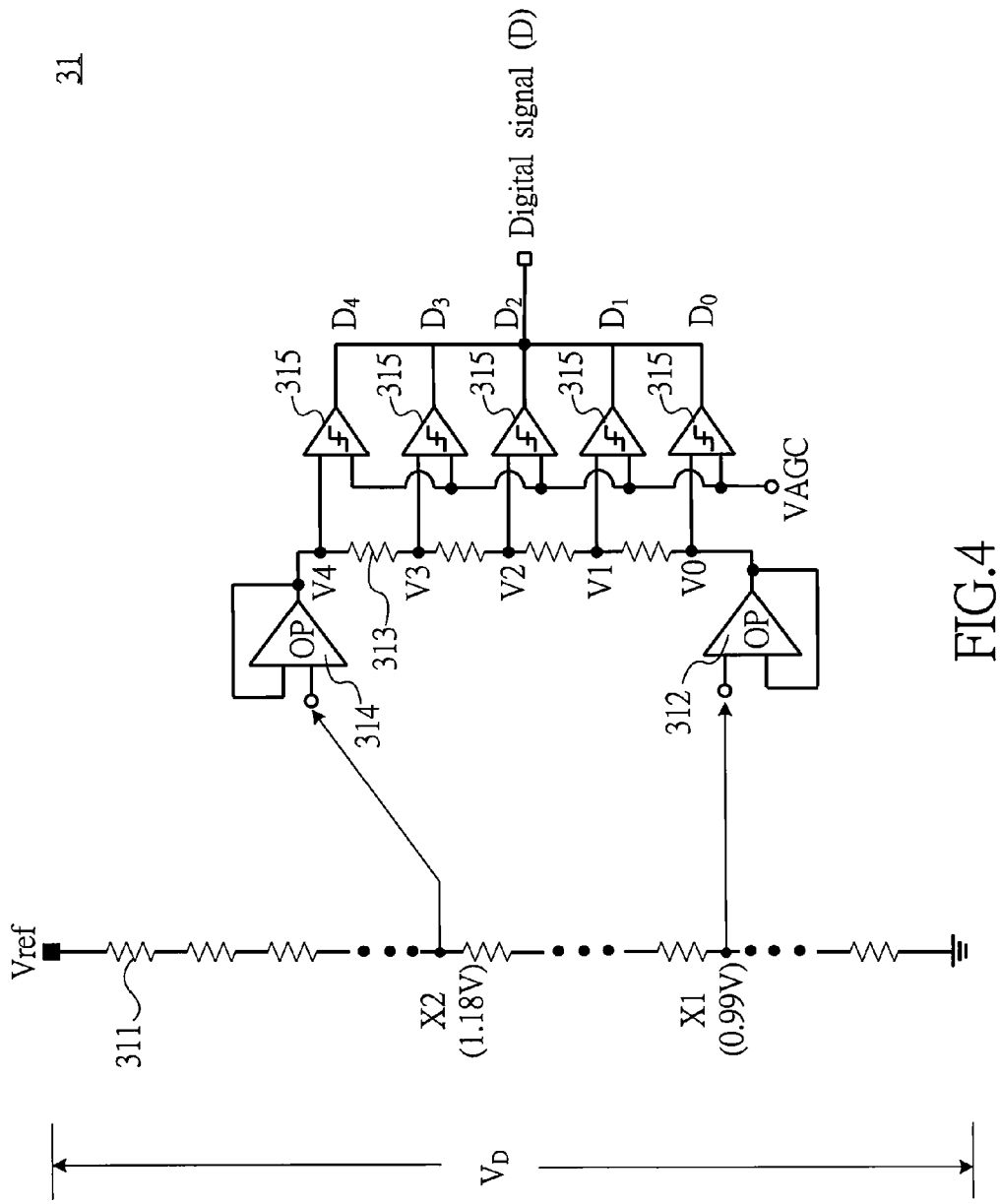
FIG. 4 is a circuit diagram of the analog to digital converter (ADC) according to the preferred embodiment of the present invention.

Referring to FIG. 2 and FIG. 4, a curve diagram showing the gain curve of the digital gain control circuit, and a circuit diagram of the analog to digital converter (ADC) according to the preferred embodiment of the present invention are disclosed. The analog to digital converter (ADC) 31 comprises a plurality of the first resistors 311, a first voltage buffer 312, a second voltage buffer 314, a plurality of the second resistors 313, and a plurality of comparators 315.

Each of the first resistors 311 is connected in series, and a load voltage VD is provided on the series-connected first resistors 311, for example, a reference voltage and a ground terminal are connected to the series-connected first resistors. The first voltage buffer 312 is connected to the first node X1 of the series-connected first resistors 311, used for receiving the first default voltage V0, such as 0.99V, which is generated from the first node X1. The second voltage buffer 314 is connected to the second node X2 of the series-connected first resistors 311, used for receiving the second default voltage V4, such as 1.18V, which is generated from the second node X2.

Each of the second resistors 313 is connected in series, and further, connected to the output end of the first voltage buffer 312 and second voltage buffer 314, used for generating a plurality of voltage levels, such as V0 to V4.

Each of comparators 315 is connected to the corresponding voltage level and the analog controlling voltage (VAGC) respectively for comparison, thereafter, a comparison result will be outputted respectively for both, such as D4 to D0, wherein each of comparison results D4 to D0 will be consisted of the digital signal D.

The wireless receiver 100 determines the multi-level gain curves, such as Gain 1 to Gain 4, according to the digital gain controlling process, wherein each gain curve will be operated with overlapping on the voltage section that is between the first default voltage V0, such as 0.99V, and the second default voltage V4, such as 1.18V, furthermore, the slop of gain curve between the first default voltage V0 and second default voltage V4 will be with a gain alteration, such as 3 db, as well as, the gain height between two adjacent gain curves will be with a gain step 41 or 43, such as 3 db or 5 db.

Moreover, there are a plurality of voltage levels, such as V0, V1, V2, V3, V4, and so on, provided between the first default voltage V0 and second default voltage V4, wherein the voltage levels can represent the switching level of the analog to digital converter (ADC) 31 as well.

According to the digital gain controlling process of the embodiment, a upper-level gain-curve switching mode and a next-level gain-curve switching mode are comprised. Regarding the next-level gain-curve switching mode, while the analog controlling voltage (VAGC) is higher than the second default voltage V4, the current level gain curve will be switched to be the next-level gain curve, as well as, regarding the upper-level gain-curve switching mode, while the analog controlling voltage (VAGC) is lower than the first default voltage V0, the current level gain curve will be switched to be the upper-level gain curve, thereby, a hysteresis effect will be occurred since the next-level gain-curve switching process and the upper-level gain-curve switching process are with the different gain switching point.

While the wireless receiver 100 receives an input signal that is with larger amplitude, the signal indicator 701 will inform to adjust the analog controlling voltage (VAGC) generated by the analog gain control circuit 20 to regulate correspondingly the amplifier gain to be decrease.

If analog controlling voltage (VAGC) is higher than the second default voltage V4 after the comparison with four voltage levels, such as V0 to V4, and conversion, then the digital signal D outputted from the analog to digital converter (ADC) 31 will be 11111, thereafter, the digital controller 33 will switch the current level gain curve to be the next-level gain curve according to the digital signal D (11111), for example, regarding the embodiment of the present invention, the digital gain control circuit 30 is operated under the gain curve (Gain 1), and further, the gain curve (Gain 1) is switched to be the next-level gain curve (Gain 2), such that the gain of the pre-amplifier 11 will be switched to be the next-level of a gain step 41.

After the gain is switched to be decreased, the signal indicator 701 of the base band chip 700 will indicate the analog controlling voltage (VAGC) to offset the alteration of the digital gain step 41. In other words, while the Gain 1 is switched to be the Gain 2, the gain is regulated to be decreased, and then, the signal indictor 701 will indicate the analog controlling voltage (VAGC) to regulate the gain to be increased for offsetting the alteration of the gain step 41.

Nevertheless, after a duty cycle, such as the loop period of the gain control for the wireless receiver 100, if the sampling result for the digital signal D by the digital controller 33 is still 11111, then the Gain 2 has to be switched to be the Gain 3 continuously due to the gain decreasing regulation is insufficient yet.

While the digital signal D is not 11111, such as the digital signal is 11110 provided on the node 411 or the gain is switched to be the last level of the gain curve, such as Gain 4, the digital gain control circuit 30 will stop to switch the gain curve for the pre-amplifier 11.

The digital gain control circuit 30 comprises a hysteresis function, therefore, while the analog controlling voltage (VAGC) is not smaller than the first default voltage V0, the digital gain control circuit 30 will not switch the current gain curve to be the upper-level gain curve, such that the wireless receiver 100 can receive signal generally since digital gain will not be switched unceasingly.

On the contrary, while the input signal is with smaller amplitude, the signal indicator 701 will inform the analog controlling voltage (VAGC) generated by analog gain control circuit 20 to regulate the gain to be increased.

If the digital gain control circuit 30 is operated under the gain curve (Gain 3), and the analog controlling voltage (VAGC) is lower than the first default voltage V0 after the comparison with four voltage levels, such as V4 to V0, and conversion, the digital signal D outputted from the analog to digital converter (ADC) 31 will be 00000, and further, the digital controller 33 will switch the gain curve (Gain3) to be the upper-level gain curve (Gain2), as well as, the gain of pre-amplifier 11 will be regulated to be the upper-level of the gain step 43.

After the gain is switched to be increased, the signal indicator 701 of the base band chip 700 will indicate the analog controlling voltage (VAGC) to offset the alteration of the digital gain step 43. In other words, while the Gain 3 is switched to be the Gain 2, the signal indictor 701 will indicate the analog controlling voltage (VAGC) to regulate the gain to be decreased for offsetting the alteration of the gain step 43.

Nevertheless, after a duty cycle, if the sampling result for the digital signal D by the digital controller 33 is still 00000, then the Gain 2 has to be switched to be the Gain 1 continuously due to the gain increasing regulation is insufficient yet.

While the digital signal D is not 00000, such as the digital signal is 11000 provided on the node 413 or the gain is switched to be the primary level of the gain curve, such as Gain 1, the digital gain control circuit 30 will stop to switch the gain curve for the pre-amplifier 11.

Moreover, the digital gain control circuit 30 comprises a hysteresis function, therefore, while the analog controlling voltage (VAGC) is not larger than the second default voltage V4, the digital gain control circuit 30 will not switch the current gain curve to be the next-level gain curve.

A hysteresis function can be jointed within the digital gain control circuit 30, thereby, each gain curve is with the different next-level gain-curve switching point and different upper-level gain-curve switching point. Moreover, the digital controller 30 will be used for switching the gain curve to be another since each gain curve has been converted according to four voltage levels for preventing the vibration of the control loop because once the analog controlling voltage (VAGC) is precisely provided on single gain switching point, and then the gain will be switched up and down unceasingly.

Furthermore, the digital gain control circuit 30 will operate each gain curve, such as Gain 1 to Gain 4, on the same voltage section that is between the first default voltage V0 and second default voltage V4, therefore, the amount of the comparators 315 of the analog to digital converter (ADC) 31 can be reduced for reducing the cost of hardware circuit as well. While the wireless receiver 100 is switching the amplified gain according to the digital gain controlling process, the proper gain curve will be switched step by step gradually for preventing an intense transient response.

Figure 5:
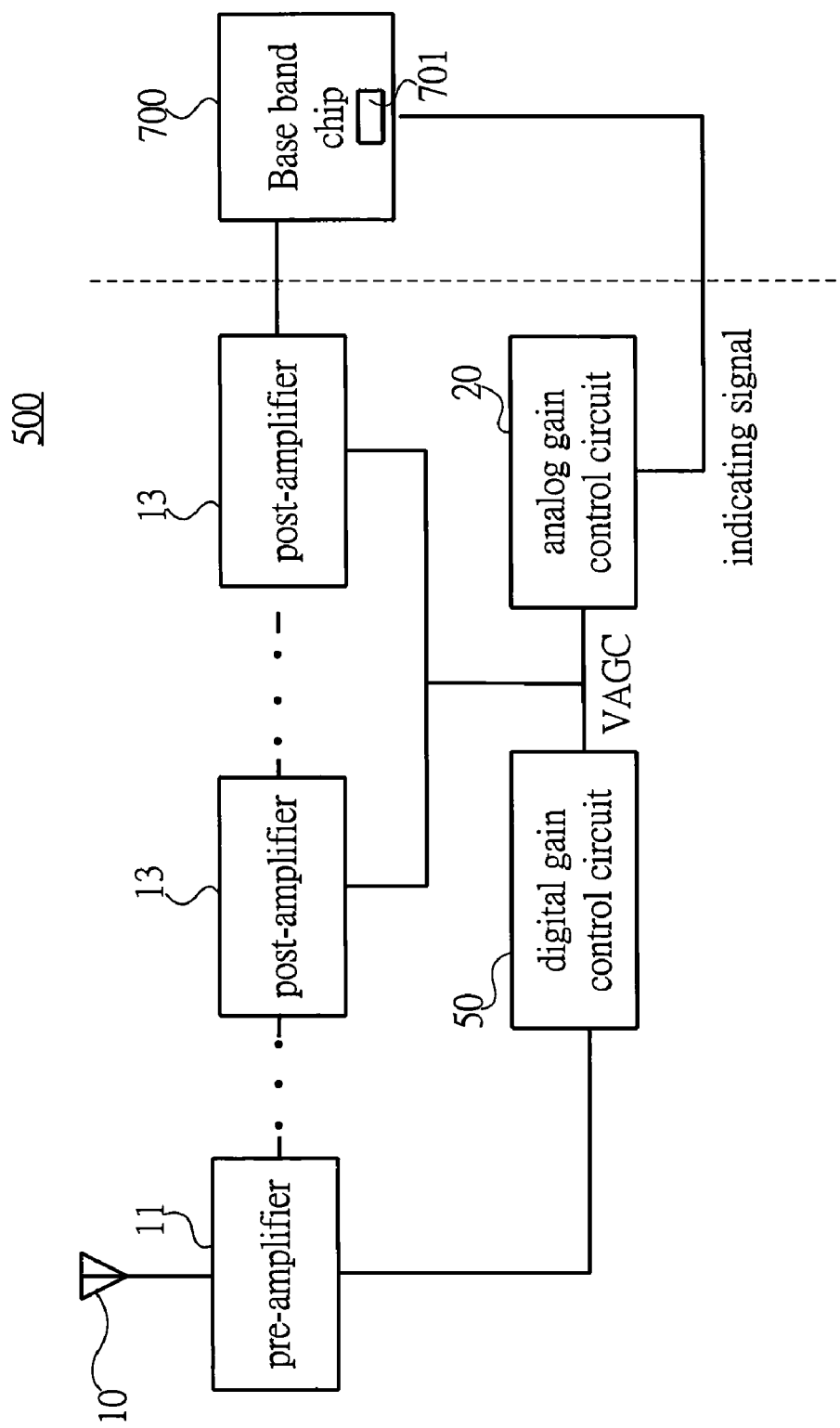
FIG. 5 is a block diagram showing a gain control circuit of the wireless receiver according to another preferred embodiment of the present invention.
Figure 6:
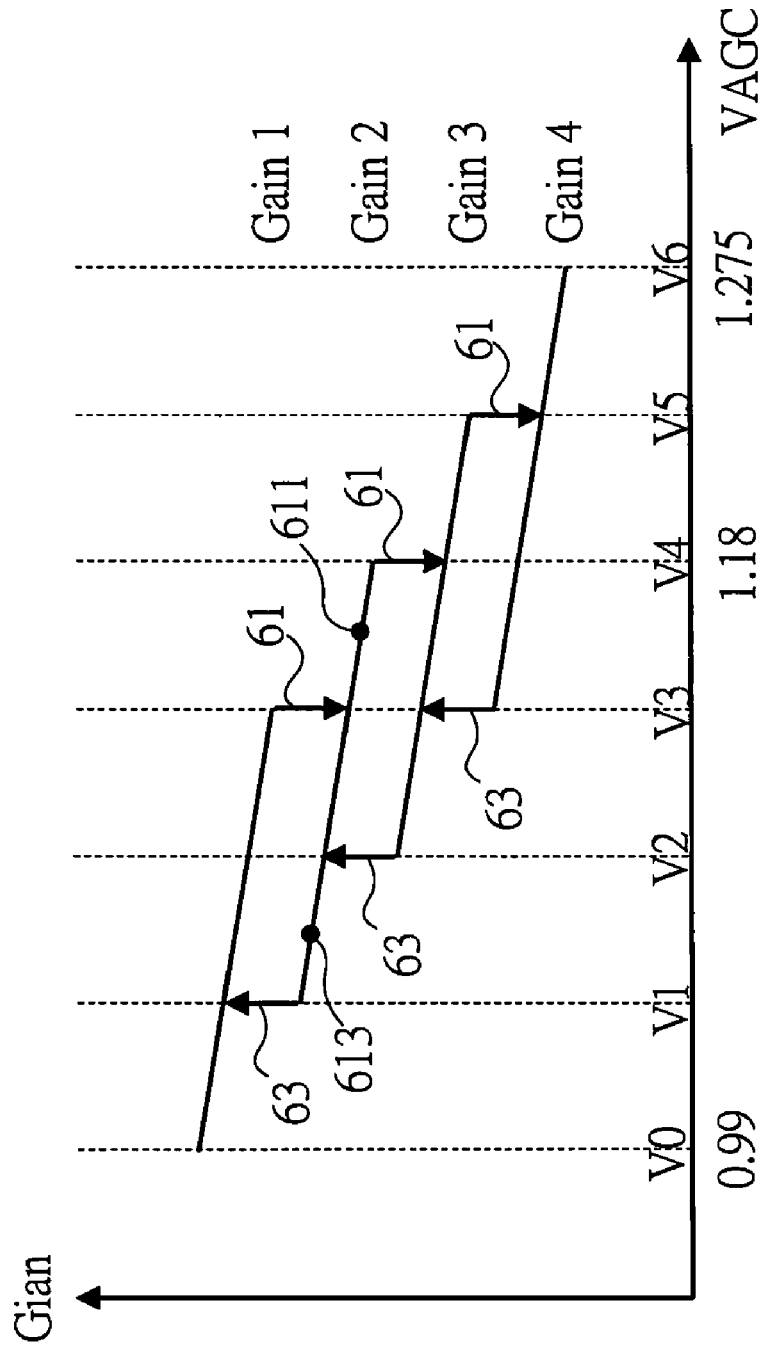
FIG. 6 is a curve diagram showing the gain curve of the digital gain control circuit according to the preferred embodiment of the present invention.

Referring to FIG. 5 and FIG. 6, a block diagram showing a gain control circuit of the wireless receiver, and a curve diagram showing the gain curve of the digital gain control circuit according to the preferred embodiment of the present invention are disclosed. The wireless receiver 500 is similar with the wireless receiver 100 described on the embodiment shown as FIG. 1. The difference between both is that the multi-level gain curves determined by the digital gain control circuit 30 are all operated under the same voltage sections, as shown on FIG. 2, however, the multi-level gain curves determined by the digital gain control circuit 50 are operated under different voltage sections respectively, as shown on FIG. 6.

The digital gain control circuit 50 is connected to the analog gain control circuit 20 and the pre-amplifier 11, used for receiving the analog controlling voltage (VAGC) generated by the analog gain control circuit 20, and further, determining the multi-level gain curves for the pre-amplifier 11, such as Gain 1 to Gain 4, as well as, and determining a first default voltage V0 and a second default voltage V6.

A plurality of voltage sections are provided between the first default voltage V0 and second default voltage V6, wherein each of gain curve is operated under different voltage sections respectively, for example, the gain curves (Gain 1) is operated between V0 to V3, the gain curves (Gain 2) is operated between V1 to V4, the gain curves (Gain 3) is operated between V2 to V5, and the gain curves (Gain 4) is operated between V3 to V6.

While the analog controlling voltage (VAGC) is over than the voltage section that is corresponding to each gain curves, the digital gain control circuit 50 will switch the gain curves to be another, thereby, the required gain of the pre-amplifier will be regulated by the digital gain controlling process.

Furthermore, two adjacent gain curves are operated under the corresponding voltage sections, partial areas of which are overlap, such as the voltage sections V1 to V3 of the gain curves (Gain 1) and (Gain 2).

Each voltage section comprises a first threshold voltage and a second threshold voltage, for example, the gain curves (Gain 1) is operated under the corresponding voltage section, the first threshold voltage of which is V0, and the second threshold voltage of which is V3.

Therefore, while the analog controlling voltage (VAGC) is higher than the second threshold voltage that is corresponding to the gain curve, the gain curve will be switched to be the next-level gain curve, otherwise, while the analog controlling voltage (VAGC) is lower than the first threshold voltage that is corresponding to the gain curve, the gain curve will be switched to be the upper-level gain curve.

Figure 7:
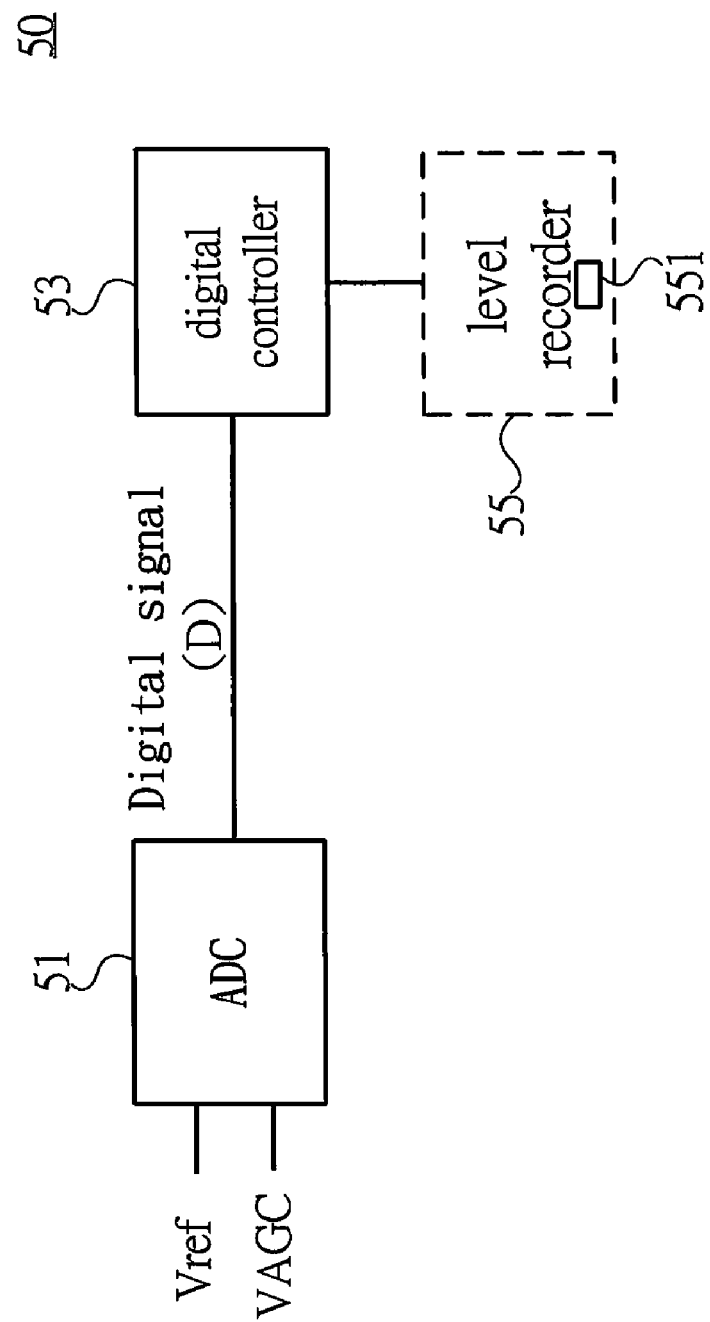
FIG. 7 is a block diagram showing the digital gain control circuit according to the preferred embodiment of the present invention.

Referring to FIG. 6 and FIG. 7, a curve diagram showing the gain curve of the digital gain control circuit, and a block diagram showing the digital gain control circuit according to the preferred embodiment of the present invention are disclosed. The digital gain control circuit 50 comprises an analog to digital converter (ADC) 51 and a digital controller 53, wherein the analog to digital converter (ADC) 51 is used for receiving an analog controlling voltage (VAGC) and a reference voltage Vref, and further, outputting a digital signal D.

The analog to digital converter (ADC) 51 determines the first default voltage V0 and the second default voltage V6 from the received reference voltage Vref, and further, determines a plurality of voltage levels V0, V1, V2, V3, V4, V5, V6, and so on, between the first default voltage V0 and second default voltage V6. The analog controlling voltage (VAGC) will compare with each voltage level for generating a digital signal D correspondingly, wherein the analog to digital converter (ADC) 51 can be a flash analog to digital converter (Flash ADC).

The digital controller 53 is connected to the analog to digital converter (ADC) 51, used for receiving the digital signal D, and further, switching the gain curve according to the digital signal D. Moreover, the digital controller 53 will determine the multi-level gain curves for the pre-amplifier 11, and further, switch to the upper-level or next-level with respect to the current level gain curve according to the digital signal D.

Figure 8:
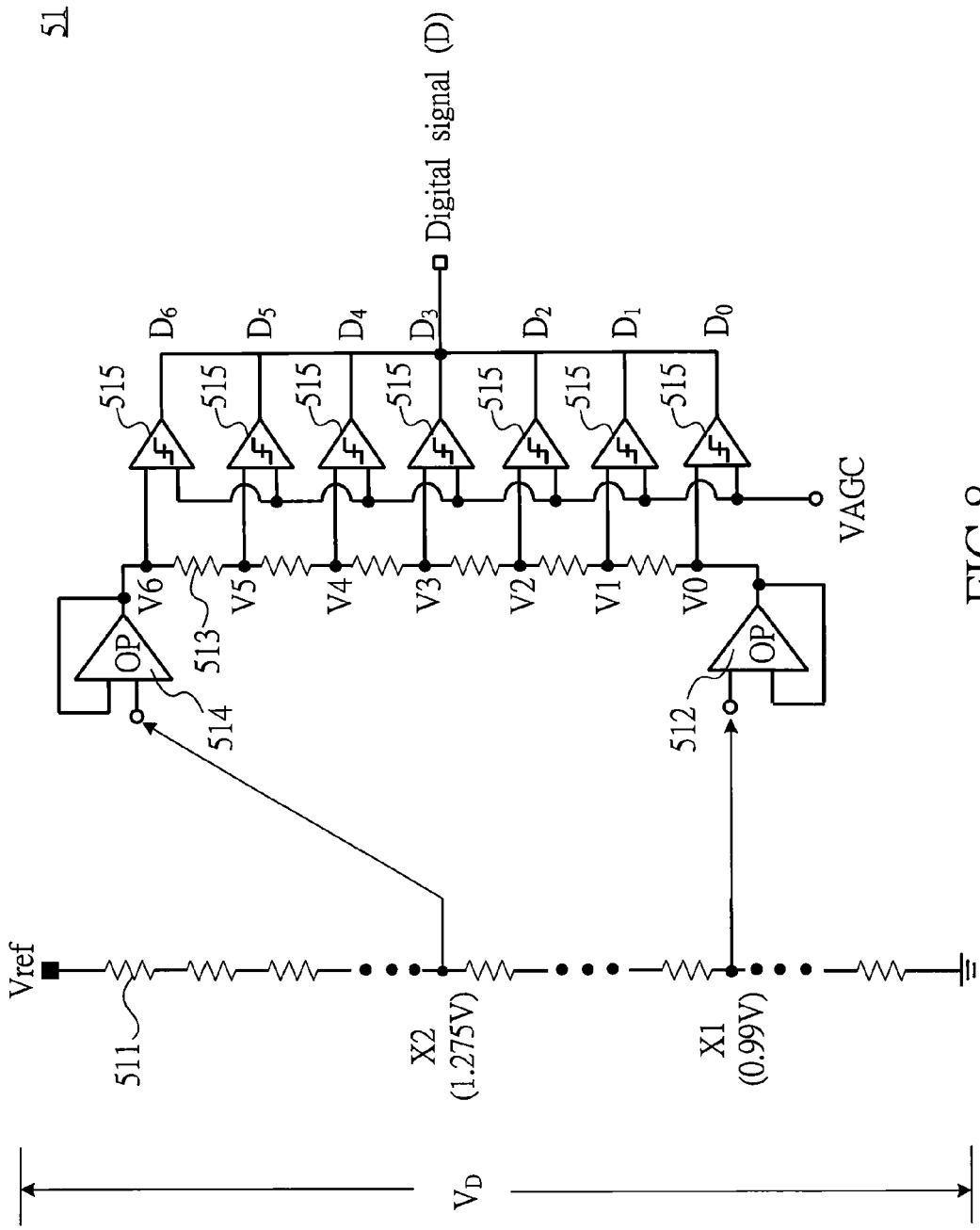
FIG. 8 is a circuit diagram of the analog to digital converter (ADC) according to the preferred embodiment of the present invention.

Referring to FIG. 6 and FIG. 8, a curve diagram showing the gain curve of the digital gain control circuit, and a circuit diagram of the analog to digital converter (ADC) according to the preferred embodiment of the present invention are disclosed. The analog to digital converter (ADC) 51 comprises a plurality of the first resistors 511, a first voltage buffer 512, a second voltage buffer 514, a plurality of the second resistors 513, and a plurality of comparators 515.

Each of the first resistors 511 is connected in series, and a load voltage $V_D$ is provided on the series-connected first resistors 511, for example, a reference voltage and a ground terminal are connected to the series-connected first resistors. The first voltage buffer 512 is connected to the first node X1 of the series-connected first resistors 511, used for receiving the first default voltage V0, such as 0.99V, which is generated from the first node X1. The second voltage buffer 514 is connected to the second node X2 of the series-connected first resistors 511, used for receiving the second default voltage V6, such as 1.275V, which is generated from the second node X2.

Each of the second resistors 513 is connected in series, and further, connected to the output end of the first voltage buffer 512 and second voltage buffer 514, used for generating a plurality of voltage levels, such as V0 to V6.

Each of comparators 515 is connected to the corresponding voltage level and the analog controlling voltage (VAGC) respectively for comparison, thereafter, a comparison result will be outputted respectively for both, such as D6 to D0, wherein each of comparison results D6 to D0 will be consisted of the digital signal D.

The wireless receiver 500 determines the multi-level gain curves, such as Gain 1 to Gain 4, according to the digital gain controlling process, wherein each gain curve will be operated under the corresponding different voltage section, which comprises a first threshold voltage and the second threshold voltage, for example, the gain curve is operated under the corresponding voltage section, the first threshold voltage of which is V1, and the second threshold voltage of which is V4, furthermore, the slop of each gain curve between the corresponding voltage sections will be with a gain alteration, such as 3 db, as well as, the gain height between two adjacent gain curves will be with a gain step 61 or 63, such as 3 db or 5 db.

Moreover, there are a plurality of voltage levels, such as V0, V1, V2, V3, V4, V5, V6, and so on, provided between the first default voltage V0 and second default voltage V6, wherein the voltage levels can represent the switching level of the analog to digital converter (ADC) 51 as well.

According to the digital gain controlling process of the embodiment, an upper-level gain-curve switching mode and a next-level gain-curve switching mode are comprised. Regarding the next-level gain-carve switching mode, while the analog controlling voltage (VAGC) is higher than the second threshold voltage of the voltage section that is used for operating by each corresponding gain curve, the current level gain curve will be switched to be the next-level gain curve, as well as, regarding the upper-level gain-curve switching mode, while the analog controlling voltage (VAGC) is lower than the first threshold voltage of the voltage section that is used for operating by each gain curve, the current level gain curve will be switched to be the upper-level gain curve. For example, while the analog controlling voltage (VAGC) is higher than V4, the gain curve (Gain 2) will be switched to be the gain curve (Gain 3), and while the analog controlling voltage (VAGC) is lower than V1, the gain curve (Gain 2) will be switched to be the gain curve (Gain 1), thereby, a hysteresis effect will be occurred between two adjacent gain curves since the next-level gain-curve switching process and the upper-level gain-curve switching process are with the different gain switching point according to each gain curve.

While the wireless receiver 500 receives an input signal that is with larger amplitude, the signal indicator 701 will inform to adjust the analog controlling voltage (VAGC) generated by the analog gain control circuit 20 to regulate correspondingly the amplifier gain to be decrease.

If analog controlling voltage (VAGC) is higher than the second threshold voltage V3 that is corresponding to the gain curve (Gain 1), then the digital signal D outputted from the analog to digital converter (ADC) 51 will be 1111000 after the comparison with three voltage levels, such as V0 to V3, and conversion, thereafter, the digital controller 53 will switch the current level gain curve to be the next-level gain curve according to the digital signal D (1111000), for example, regarding to the embodiment of the present invention, the digital gain control circuit 50 is operated under the gain curve (Gain 1), and further, the gain curve (Gain 1) is switched to be the next-level gain curve (Gain 2), such that the gain of the pre-amplifier 11 will be switched to be the next-level of a gain step 61.

After the gain is switched to be decreased, the signal indicator 701 of the base band chip 700 will indicate the analog controlling voltage (VAGC) to offset the alteration of the digital gain step 61. In other words, while the Gain 1 is switched to be the Gain 2, the gain is regulated to be decreased, and then, the signal indictor 701 will indicate the analog controlling voltage (VAGC) to regulate the gain to be increased for offsetting the gain alteration of the gain step 61.

Nevertheless, after a duty cycle, if the analog controlling voltage (VAGC) is still used for continuously regulating the gain to be decreased, correspondingly, the analog controlling voltage is further higher than the second threshold voltage V4 that is corresponding to the gain curve (Gain 2), and then the digital controller 53 will continuously switch the gain curve (Gain 2) to be the next-level gain curve (Gain 3) according to the digital signal D (1111100) generated by the analog to digital converter (ADC) 51 due to the gain decreasing regulation is insufficient yet.

Otherwise, the analog controlling voltage (VAGC) will tend to be stable, and be provided between the voltage section (V1 to V4) that is used for operating by the gain curve (Gain 2), such as node 611, or the gain curve has been switched to be the last level gain curve, such as Gain 4, therefore, the digital gain control circuit 50 will stop to switch the current level gain curve to be the next-level gain curve regarding the pre-amplifier 11.

Since a hysteresis function is designed regarding the digital gain control circuit 50 of the present invention, the analog controlling voltage (VAGC) is not smaller than the first threshold voltage that is corresponding to the current level gain curve, therefore, the digital controller 53 will not switch the current level gain curve to be upper-level gain curve.

On the contrary, while the input signal is with smaller amplitude, the signal indicator 701 will inform the analog controlling voltage (VAGC) generated by analog gain control circuit 20 to regulate the gain to be increased.

If the digital gain control circuit 50 is operated under the gain curve (Gain 3), and the analog controlling voltage (VAGC) is used for regulating the gain to be increased, correspondingly, the analog controlling voltage (VAGC) is lower than the first threshold voltage V2 that is corresponding to the gain curve (Gain 3), the digital signal D outputted from the analog to digital converter (ADC) 51 will be 1100000, and further, the digital controller 53 will directly switch the gain curve (Gain3) to be the upper-level gain curve (Gain2) according to the digital signal D (1100000), as well as, the gain of pre-amplifier 11 will be regulated to be the upper-level of the gain step 63.

After the gain is switched to be increased, the signal indicator 701 of the base band chip 700 will indicate the analog controlling voltage (VAGC) to offset the alteration of the digital gain step 53. In other words, while the Gain 3 is switched to be the Gain 2, the signal indictor 701 will indicate the analog controlling voltage (VAGC) to regulate the gain to be decreased for offsetting the alteration of the gain step 63.

Nevertheless, after a duty cycle, if the analog controlling voltage (VAGC) is still used for continuously regulating the gain to be increased, correspondingly, the analog controlling voltage is further lower than the first threshold voltage V1 that is corresponding to the gain curve (Gain 2), and then the digital controller 53 will continuously switch the gain curve (Gain 2) to be the upper-level gain curve (Gain 1) according to the digital signal D (1000000) generated by the analog to digital converter (ADC) 51 due to the gain increasing regulation is insufficient yet.

Otherwise, the analog controlling voltage (VAGC) will tend to be stable, and be provided between the voltage section (V1 to V4) that is used for operating by the gain curve (Gain 2), such as node 613, or the gain curve has been switched to be the primary level gain curve, such as Gain 1, therefore, the digital gain control circuit 50 will stop to switch the current level gain curve to be the upper-level gain curve regarding the pre-amplifier 11.

Surely, a hysteresis function can be jointed within the digital gain control circuit 50, thereby, each gain curve is with the different next-level gain-curve switching point and different upper-level gain-curve switching point. Moreover, the digital controller 50 will be used for switching the gain curve to be another since each gain curve has been converted according to three voltage levels for preventing the vibration of the control loop because once the analog controlling voltage (VAGC) is precisely provided on single gain switching point and then the gain will be switched up and down unceasingly.

Similarly, while the wireless receiver 500 is switching the amplified gain according to the digital gain controlling process, the proper gain curve will be switched step by step gradually for preventing an intense transient response.

Furthermore, referring to FIG. 7 again, the digital gain control circuit 50 further comprises a level recorder 55 for preventing the digital gain being switched over back and forth unceasingly, and further, correctly switching the gain curve.

The level recorder 55 is connected to the digital controller 53. The level recorder 55 comprises a level information 551, which is used for recording the current level gain curve. The level recorder 55 can selectively consist of an accumulator, an inverse-accumulator, and/or a register.

Since each gain curve is operated under different voltage section and each gain curve is with different switching point as well, the gain curve may be switched incorrectly due to the digital controller 53 is without the information about the current level gain curve.

For example, regarding the digital signal D is 1111000, the gain curve (Gain 2) is unnecessary to be switched, however, while the gain curve (Gain 1) can be switched to be the next-level gain curve due to the condition for switching is enable, such as the analog controlling voltage (VAGC) is higher than the second threshold voltage V3, and the digital controller 53 doesn't switch the gain curve according to the level information 551 correspondingly, the error will be occurred.

Therefore, according to the level recorder 55, the digital controller 53 can has the status about the current level of the gain curve from the level information 551 recorded on the level recorder 55, and switch the gain curve according to the digital signal D cooperatively, such that the error of gain switch can be prevented accordingly.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A gain control circuit of the wireless receiver, comprising:
   a plurality of stage-amplifiers, comprising at least one pre-amplifier and a plurality of post-amplifiers, wherein said post-amplifiers are connected to said pre-amplifier;
   an analog gain control circuit, connected to said post-amplifiers, used for generating an analog controlling voltage to regulate the gain of said post-amplifiers by an analog gain controlling process; and
   a digital gain control circuit, connected to said analog gain control circuit and said pre-amplifier, used for receiving said analog controlling voltage, and determining multi-level gain curves for said pre-amplifier, wherein said gain curves are all operated between a first default voltage and a second default voltage, wherein while said analog controlling voltage is over than the voltage section between said first default voltage and said second default voltage, said gain curve will be switched.

2. The gain control circuit of claim 1, wherein said gain curve will be switched to the next-level gain curve while said analog controlling voltage is higher than said second default voltage, and said gain curve will be switched to the upper-level gain curve while said analog controlling voltage is lower than said first default voltage.

3. The gain control circuit of claim 1, wherein said digital gain control circuit comprises:
   an analog to digital converter (ADC), used for receiving said analog controlling voltage and a reference voltage, and further, determining said first default voltage and said second default voltage from said reference voltage, as well as, a plurality of voltage levels providing between said first default voltage and said second default voltage, wherein said analog controlling voltage compares with each voltage level for generating a digital signal correspondingly; and
   a digital controller, connected to said analog to digital converter (ADC), for receiving said digital signal, and further, switching said gain curve according to said digital signal.

4. The gain control circuit of claim 3, wherein said digital controller determines said multi-level gain curves for said pre-amplifier, and further, determines to switch one of said multi-level gain curves to be the next-level- gain curve or upper-level gain curve according to said digital signal.

5. The gain control circuit of claim 3, wherein said digital controller samples said digital signal generated from said analog to digital converter (ADC) during every duty cycle.

6. The gain control circuit of claim 3, wherein said analog to digital converter (ADC) comprises:
   a plurality of the first resistors, connected in series, wherein a load voltage is formed on said series-connected first resistors;
   a first voltage buffer, connected to a first node of said series-connected first resistors, wherein said first default voltage is generated from said first node;
   a second voltage buffer, connected to a second node of said series-connected first resistors, wherein said second default voltage is generated from said second node;
   a plurality of the second resistors, connected in series between the output ends of said first voltage buffer and said second voltage buffer, used for generating a plurality of voltage levels; and
   a plurality of comparators, connected to the corresponding voltage levels respectively and said analog controlling voltage, used for generating said digital signal according to the comparison result of said voltage levels and said analog controlling voltage.

7. The gain control circuit of claim 6, wherein said series-connected first resistors are connected between a reference voltage and a ground terminal.

8. The gain control circuit of claim 3, wherein said analog to digital converter (ADC) is a flash analog to digital converter (Flash ADC).

9. The gain control circuit of claim 3, wherein said analog gain control circuit is used for receiving an indicating signal, and further, generating said analog controlling voltage according to said indicating signal.

10. The gain control circuit of claim 9, wherein said indicating signal is generated from a signal indicator that is integrated within a base band chip, an intermediate frequency (IF) circuit, or a zero-intermediate-frequency circuit.

11. A gain control circuit of the wireless receiver, comprising:
    a plurality of stage-amplifiers, comprising at least one pre-amplifier and a plurality of post-amplifiers, wherein said post-amplifiers are connected to said pre-amplifier;
    an analog gain control circuit, connected to said post-amplifiers, used for generating an analog controlling voltage to regulate the gain of said post-amplifiers by said analog gain controlling process; and
    a digital gain control circuit, connected to said analog gain control circuit and said pre-amplifier, used for receiving said analog controlling voltage, and determining the multi-level gain curves for said pre-amplifier, wherein said gain curves are all operated between a first default voltage and a second default voltage, wherein a plurality of voltage sections are provided between said first default voltage and said second default voltage, and each gain curve is operated in the different corresponding voltage section, wherein while said analog controlling voltage is over than said voltage section that is corresponding to each gain curve, said gain curve will be switched to be another, wherein two adjacent gain curves are operated under the corresponding voltage sections, partial areas of which are overlap.

12. The gain control circuit of claim 11, wherein each voltage section comprises a first threshold voltage and a second threshold voltage.

13. The gain control circuit of claim 12, wherein said gain curve will be switched to be the next-level gain curve while said analog controlling voltage is higher than said second threshold voltage that is corresponding to said gain curve, and said gain curve will be switched to be the upper-level gain curve while said analog controlling voltage is lower than said first threshold voltage that is corresponding to said gain curve.

14. The gain control circuit of claim 11, wherein said digital gain control circuit comprises:
   an analog to digital converter (ADC), used for receiving said analog controlling voltage and a reference voltage, and further, determining said first default voltage and second default voltage from said reference voltage, as well as, a plurality of voltage levels providing between said first default voltage and said second default voltage, wherein said analog controlling voltage compares with each voltage level for generating a digital signal correspondingly; and
   a digital controller, connected to said analog to digital converter (ADC), used for receiving said digital signal, and further, switching said gain curve according to said digital signal.

15. The gain control circuit of claim 14, wherein said digital controller determines said multi-level gain curves for said pre-amplifier, and further, determines to switch one of said multi-level gain curves to be the next-level gain curve or upper-level gain curve according to said digital signal.

16. The gain control circuit of claim 14, wherein said digital gain control circuit comprises a level recorder, which is used for recording the current level of said gain curve.

17. The gain control circuit of claim 14, wherein said analog to digital converter (ADC) comprises:
   a plurality of the first resistors, connected in series, wherein a load voltage is formed on said series-connected first resistors;
   a first voltage buffer, connected to a first node of said series-connected first resistors, wherein said first default voltage is generated from said first node;
   a second voltage buffer, connected to a second node of said series-connected first resistors, wherein said second default voltage is generated from said second node;
   a plurality of the second resistors, connected in series between the output ends of said first voltage buffer and said second voltage buffer, used for generating a plurality of voltage levels; and
   a plurality of comparators, connected to the corresponding voltage levels respectively and said analog controlling voltage, used for generating said digital signal according to the comparison result of said voltage levels and said analog controlling voltage.

18. The gain control circuit of claim 17, wherein said series-connected first resistors are connected between a reference voltage and a ground terminal.

19. The gain control circuit of claim 14, wherein said analog to digital converter (ADC) is a flash analog to digital converter (Flash ADC).

20. The gain control circuit of claim 11, wherein said analog gain control circuit is used for receiving an indicating signal, and further, generating said analog controlling voltage according to said indicating signal.

21. The gain control circuit of claim 20, wherein said indicating signal is generated from a signal indicator that is integrated within a base band chip, an intermediate frequency (IF) circuit, or a zero-intermediate-frequency (Zero-IF) circuit.

* * * * *